US009106190B2

(12) United States Patent
Devison

(10) Patent No.: US 9,106,190 B2
(45) Date of Patent: Aug. 11, 2015

(54) MOBILE WIRELESS COMMUNICATIONS DEVICE WITH IMPEDANCE MATCHING AND RELATED METHODS

(75) Inventor: Stephen Arnold Devison, Kitchener (CA)

(73) Assignee: BLACKBERRY LIMITED, Waterloo (CA)

( * ) Notice: Subject to any disclaimer, the term of this patent is extended or adjusted under 35 U.S.C. 154(b) by 622 days.

(21) Appl. No.: 13/354,520

(22) Filed: Jan. 20, 2012

(65) Prior Publication Data
US 2013/0188671 A1    Jul. 25, 2013

(51) Int. Cl.
| H04W 88/02 | (2009.01) |
| H04B 1/38 | (2006.01) |
| H03F 1/56 | (2006.01) |
| H04B 1/04 | (2006.01) |
| H03F 3/24 | (2006.01) |

(52) U.S. Cl.
CPC .. *H03F 1/56* (2013.01); *H03F 3/24* (2013.01); *H04B 1/0458* (2013.01); *H03F 2200/321* (2013.01); *H03F 2200/387* (2013.01)

(58) Field of Classification Search
CPC  H04B 1/0458; H04B 17/0062; H03F 1/3247; H03L 2207/50
See application file for complete search history.

(56) References Cited

U.S. PATENT DOCUMENTS

| 7,817,747 | B2 | 10/2010 | Waheed et al. | 375/298 |
| 7,917,105 | B2* | 3/2011 | Drogi et al. | 455/126 |
| 8,050,375 | B2 | 11/2011 | Staszewski et al. | 375/373 |
| 8,055,217 | B2* | 11/2011 | Ba et al. | 455/114.3 |
| 2007/0142014 | A1* | 6/2007 | Wilcox | 455/276.1 |
| 2007/0290749 | A1* | 12/2007 | Woo et al. | 330/149 |
| 2008/0192877 | A1 | 8/2008 | Eliezer et al. | 375/376 |
| 2008/0207240 | A1 | 8/2008 | Rofougaran | 455/517 |
| 2008/0280571 | A1* | 11/2008 | Rofougaran et al. | 455/77 |
| 2009/0253385 | A1* | 10/2009 | Dent et al. | 455/83 |
| 2010/0041361 | A1 | 2/2010 | Ojo | 455/334 |
| 2010/0150013 | A1 | 6/2010 | Hara et al. | 370/252 |
| 2011/0086600 | A1* | 4/2011 | Muhammad | 455/120 |

OTHER PUBLICATIONS

Qiao et al., "Real-time Adaptation to Antenna Impedance Mismatch for CDMA Transceivers," accessed Jan. 10, 2012; 16 pages.

* cited by examiner

*Primary Examiner* — Shuwang Liu
*Assistant Examiner* — Ross Varndell
(74) *Attorney, Agent, or Firm* — Guntin & Gust, PLC; Andrew Gust

(57) ABSTRACT

A mobile wireless communications device may include a processor configured to generate a baseband signal, a modulator coupled downstream from the processor, a power amplifier coupled downstream from the modulator, an antenna, and a tunable antenna matching network coupled between the power amplifier and the antenna and configured to match an impedance of the antenna and thereby causing a phase change in an output from the antenna. The processor may be configured to provide upstream phase change compensation in the baseband signal for the phase change in the output from the antenna.

16 Claims, 4 Drawing Sheets

MOBILE WIRELESS COMMUNICATIONS DEVICE WITH IMPEDANCE MATCHING AND RELATED METHODS

TECHNICAL FIELD

This application relates to the field of communications, and more particularly, to wireless communications systems and related methods.

BACKGROUND

Mobile communication systems continue to grow in popularity and have become an integral part of both personal and business communications. Various mobile devices now incorporate Personal Digital Assistant (PDA) features such as calendars, address books, task lists, calculators, memo and writing programs, media players, games, etc. These multi-function devices usually allow electronic mail (email) messages to be sent and received wirelessly, as well as access the Internet via a cellular network and/or a wireless local area network (WLAN), for example.

Cellular devices have radio frequency (RF) processing circuits and receive or transmit radio communications signals typically using modulation schemes. In the typical device, the RF processing circuits may include a modulator, a power amplifier coupled downstream from the modulator, and an antenna coupled downstream from the power amplifier. Depending on the immediate surroundings of the cellular device, the impedance load of the antenna may vary, which can impact antenna performance.

Some cellular devices include an impedance matching device between the antenna and the power amplifier to compensate for the impedance mismatches. One drawback to this approach is that a phase change is imparted onto the transmitted signal. Depending on the wireless protocol being used, this may cause issues with the receiver device.

DETAILED DESCRIPTION OF THE PREFERRED EMBODIMENTS

Figure 1:
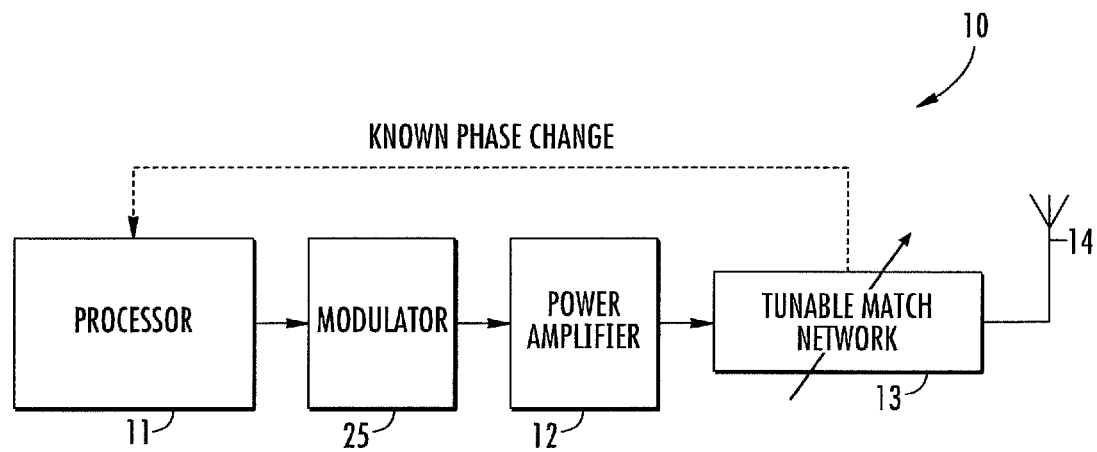
FIG. 1 is a schematic block diagram of an example embodiment of a mobile wireless communications device.

The present description is made with reference to the accompanying drawings, in which embodiments are shown. However, many different embodiments may be used, and thus the description should not be construed as limited to the embodiments set forth herein. Rather, these embodiments are provided so that this disclosure will be thorough and complete. Like numbers refer to like elements throughout.

Generally speaking, a mobile wireless communications device may include a processor configured to generate a baseband signal, a modulator coupled downstream from the processor, and a power amplifier coupled downstream from the modulator. The mobile wireless communications device may also include an antenna, and a tunable antenna matching network coupled between the power amplifier and the antenna and configured to match an impedance of the antenna and thereby causing a phase change in an output from the antenna. The processor may be configured to provide upstream phase change compensation in the baseband signal for the phase change in the output from the antenna.

More specifically, the mobile wireless communications device may further comprise a feedback path between the tunable antenna matching network and the processor. The tunable antenna matching network may be configured to dynamically match the impedance of the antenna. The processor may be configured to provide the upstream phase change compensation based upon an inverse of the phase change in the output from the antenna.

The processor may be configured to provide the upstream phase change compensation substantially simultaneously with the phase change in the output from the antenna. Furthermore, the tunable antenna matching network may be configured to match the impedance of the antenna substantially instantaneously.

In some embodiments, the processor may be configured to generate digital baseband In-phase (I) and Quadrature (Q) signals. The modulator may comprise I and Q circuits coupled between the processor and the power amplifier. Also, each of the I and Q circuits may comprise a digital-to-analog converter (DAC), a low pass filter coupled to an output of the DAC, and a mixer coupled to an output of the low pass filter. Additionally, the mobile wireless communications device may further comprise an antenna switch coupled between the power amplifier and the antenna.

Another aspect is directed to a method of providing impedance matching in a mobile wireless communications device. The mobile wireless communications device may comprise a processor generating a baseband signal, a modulator coupled downstream from the processor, a power amplifier coupled downstream from the modulator, an antenna, and a tunable antenna matching network coupled between the power amplifier and the antenna. The method may include matching an impedance of the antenna and thereby causing a phase change in an output from the antenna using the tunable antenna matching network, and providing upstream phase change compensation in the baseband signal for the phase change in the output from the antenna.

Figure 3:
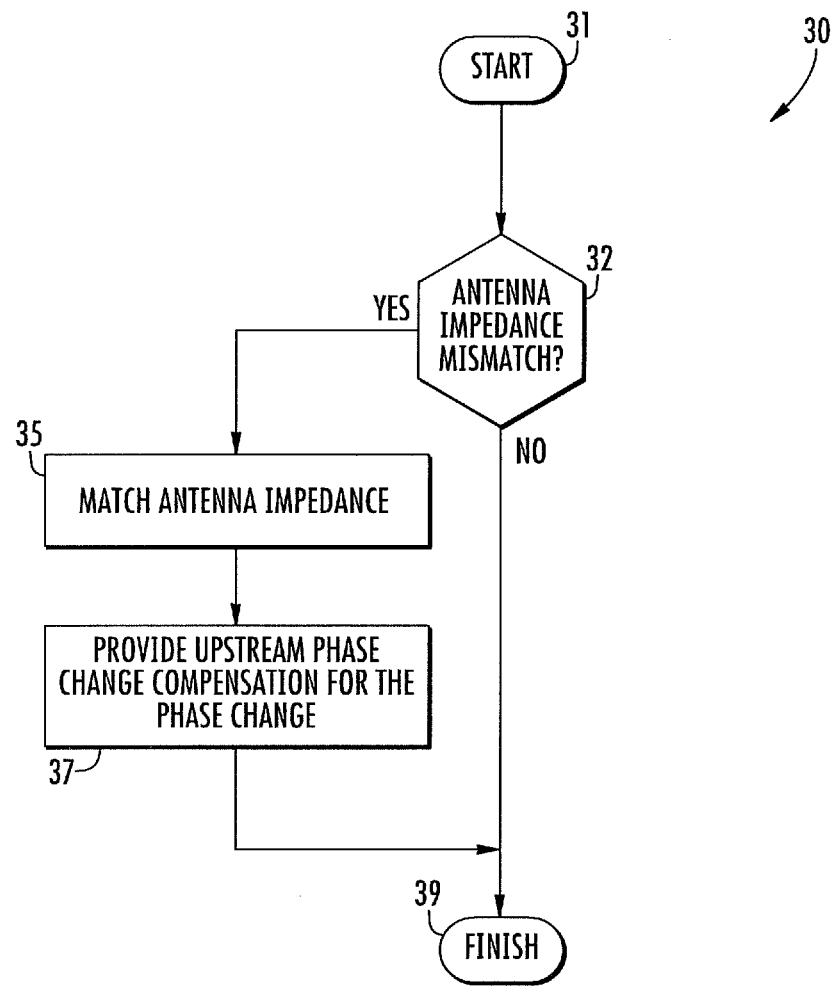
FIG. 3 is a flowchart illustrating operation of the mobile wireless communications device of FIG. 1.

Referring now to FIG. 1, a mobile wireless communications device 10 according to the present disclosure is now described. Moreover, with reference additionally to FIG. 3, a flowchart 30 illustrates a method of operating the mobile wireless communications device 10 (Block 31). Example mobile wireless communications devices may include portable or personal media players (e.g., music or MP3 players, video players, etc.), remote controls (e.g., television or stereo remotes, etc.), portable gaming devices, portable or mobile telephones, smartphones, tablet computers, etc.

The mobile wireless communications device 10 illustratively includes a processor 11 configured to generate a baseband signal, a modulator 25 coupled downstream from the processor, and a power amplifier 12 coupled downstream from the modulator. The mobile wireless communications device 10 illustratively includes an antenna 14, and a tunable antenna matching network 13 coupled between the power amplifier 12 and the antenna.

During use, the immediate environment of the mobile wireless communications device 10 may cause changes in the load impedance of the antenna 14. For example, the position of the user's hand may unintentionally change the impedance of the antenna 14 and cause degraded performance, or the user may place the mobile wireless communications device 10 on a flat metallic surface, such as a desk. To compensate for this occurrence, the tunable antenna matching network 13 is configured to match an impedance of the antenna 14, which causes a phase change in an output from the antenna 14 (Blocks 33 & 35). In some communication protocols, such as 3GPP Long Term Evolution (LTE), there is a threshold/limit to the amount of phase change in a transmitted signal from a device. Accordingly, in typical devices, due to phase change resulting from the typical impedance matching operations, the typical device limits the speed of impedance matching so as not to violate the communication protocol phase change threshold. Of course, this may result in poor performance while the device moves to match antenna impedance.

In the illustrated embodiment, the mobile wireless communications device 10 includes a feedback path between the tunable antenna matching network 13 and the processor 11. Using this feedback path, the tunable antenna matching network 13 communicates the phase change in the transmitted signal. The processor 11 is configured to provide upstream phase change compensation in the baseband signal for the phase change in the output from the antenna 14 based upon the data from the feedback path (Block 37). More specifically, the tunable antenna matching network 13 is configured to dynamically match the impedance of the antenna 14, i.e. matching the impedance in real time and as fast as possible. Advantageously, the processor 11 is configured to provide the upstream phase change compensation substantially simultaneously with the phase change in the output from the antenna 14. Furthermore, the tunable antenna matching network 13 is configured to match the impedance of the antenna 14 substantially instantaneously.

More specifically, the speed of phase change within the tunable antenna matching network 13 can be very fast. This is the reason why the typical device slows down the matching process. For example, 3GPP wideband code division multiple access (WCDMA) allows no more than 30 degrees of phase change within any 666.66 micro-second period. Furthermore, phase changes larger than 30 degrees can only happen once in any 3 milli-second period, and phase changes larger than 60 degrees are never allowed. In the mobile wireless communications device 10, the processor 11 would be configured to simultaneously change the match and correct the phase on the order of 1 micro-second. This allows the matching to be applied substantially faster than otherwise possible.

For example, the processor 11 may be configured to provide the upstream phase change compensation based upon an inverse of the phase change in the output from the antenna 14. In some embodiments, since both magnitude and phase of the antenna impedance match are unknown, these two pieces of information are needed to calculate the required impedance match. The required phase and magnitude change can be calculated using the forward and reverse voltage waveforms from a directional coupler (not shown), which is placed before the antenna 14. The antenna reflection coefficient is a function of the complex load impedance and the complex source impedance, and can be shown as: $\Gamma=(Z_L-Z_O)/(Z_L+Z_O)=E_r/E_i$.

$E_r$ and $E_i$ are the reflected and incident voltages captured from the directional coupler. With $Z_O$, $E_r$, and $E_i$ known, the load is calculated as: $Z_L=-Z_O*(\Gamma+1)/(\Gamma-1)$. Due to the slowly varying nature of the antenna match, these values can be monitored at separate times, requiring only one transducer to digitize the values for calculation. The coupled RF can be downconverted via an auxiliary receiver and analog-to-digital converter. With $Z_L$ known, the difference in phase from the previous $Z_L$ ($Z_{L'}$) can be calculated. If the new antenna match is updated instantaneously, the RF phase will also change by the difference between $Z_L$ and $Z_{L'}$, but if the opposite phase correction is applied upstream in the digital chain (e.g. at the processor 11), the RF will not contain any phase change. Accordingly, the antenna impedance match can be immediately applied to the antenna 14 without violating the need for small instantaneous phase changes in the RF (Block 39).

Figure 2:
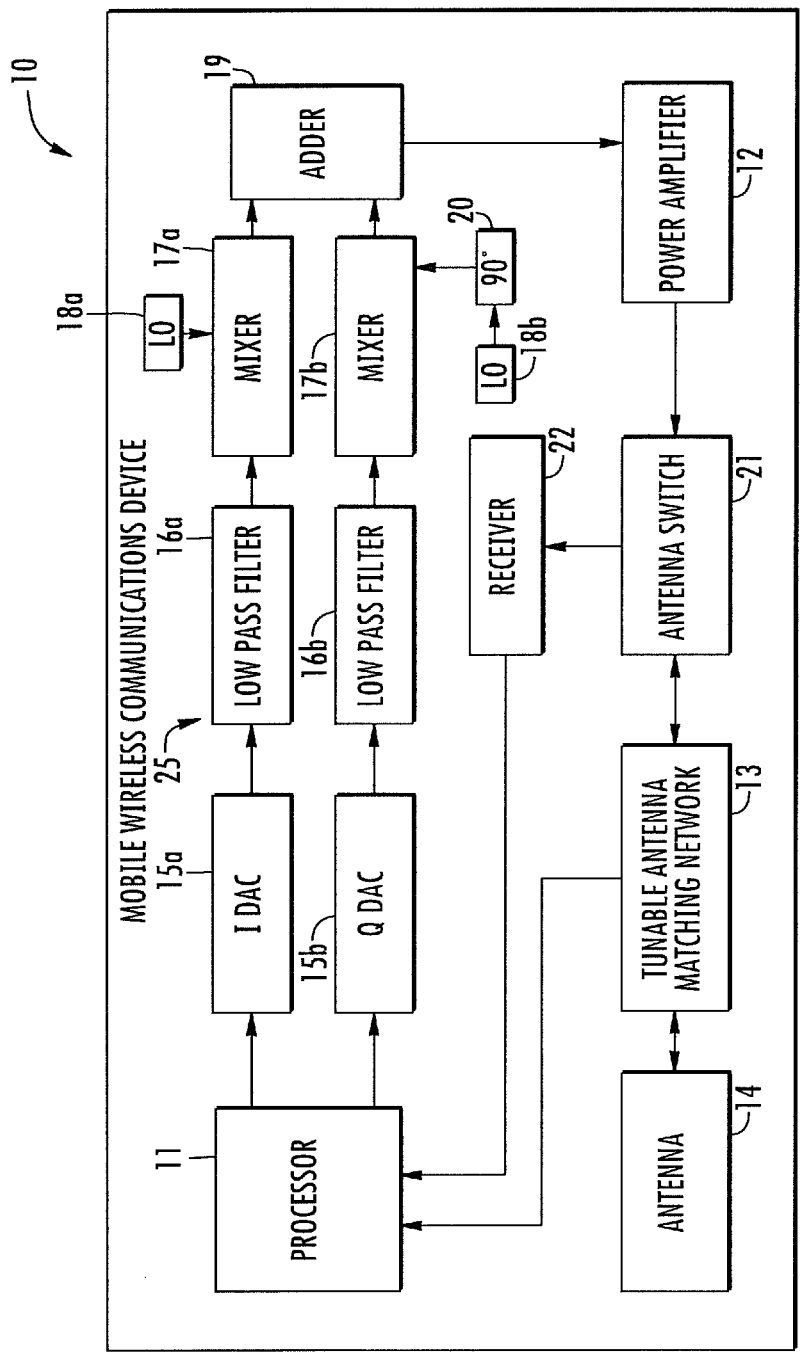
FIG. 2 is a more detailed schematic block diagram of the mobile wireless communications device of FIG. 1.

Referring additionally to FIG. 2, the processor 11 is configured to generate digital baseband I and Q signals. The modulator 25 illustratively includes I and Q circuits coupled between the processor 11 and the power amplifier 12. Also, each of the I and Q circuits illustratively includes a DAC 15a-15b, a low pass filter 16a-16b coupled to an output of the DAC, and a mixer 17a-17b coupled to an output of the low pass filter. The I circuit includes a local oscillator 18a coupled to the mixer 17a, and the Q circuit includes a local oscillator 18b, and a 90 degrees phase chance block 20 coupled downstream therefrom and to the mixer 17b. The mobile wireless communications device 10 illustratively includes an adder 19 configured to combine the modulated I and Q signals, an antenna switch 21 coupled between the power amplifier 12 and the antenna, and a receiver block 22 coupled between the antenna switch 21 and the processor 11.

Another aspect is directed to a method of providing impedance matching in a mobile wireless communications device 10. The mobile wireless communications device 10 may comprise a processor 11 generating a baseband signal, a modulator 25 coupled downstream from the processor, a power amplifier 12 coupled downstream from the modulator, an antenna 14, and a tunable antenna matching network 13 coupled between the power amplifier and the antenna. The method may include matching an impedance of the antenna 14 and thereby causing a phase change in an output from the antenna using the tunable antenna matching network 13, and providing upstream phase change compensation for the phase change in the output from the antenna.

Example components of a mobile wireless communications device 1000 that may be used in accordance with the above-described embodiments are further described below with reference to FIG. 4. The device 1000 illustratively includes a housing 1200, a keyboard or keypad 1400 and an output device 1600. The output device shown is a display 1600, which may comprise a full graphic liquid crystal display (LCD). Other types of output devices may alternatively be utilized. A processing device 1800 is contained within the housing 1200 and is coupled between the keypad 1400 and the display 1600. The processing device 1800 controls the operation of the display 1600, as well as the overall operation of the mobile device 1000, in response to actuation of keys on the keypad 1400.

The housing 1200 may be elongated vertically, or may take on other sizes and shapes (including clamshell housing structures). The keypad may include a mode selection key, or other hardware or software for switching between text entry and telephony entry.

Figure 4:
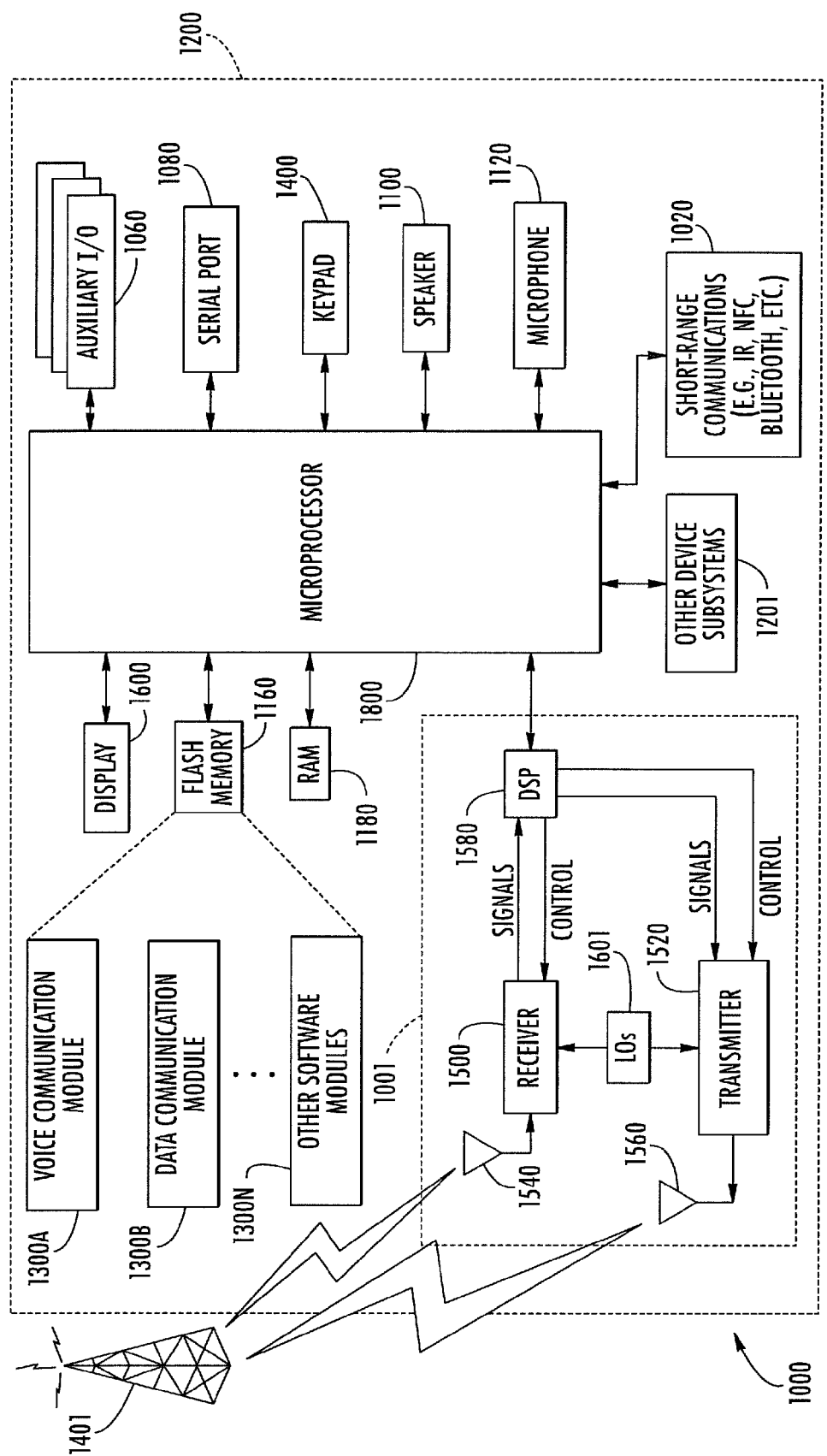
FIG. 4 is a schematic block diagram illustrating example components for the mobile wireless communications device of FIG. 1.

In addition to the processing device 1800, other parts of the mobile device 1000 are shown schematically in FIG. 4. These include a communications subsystem 1001; a short-range communications subsystem 1020; the keypad 1400 and the display 1600, along with other input/output devices 1060, 1080, 1100 and 1120; as well as memory devices 1160, 1180 and various other device subsystems 1201. The mobile device 1000 may comprise a two-way RF communications device having data and, optionally, voice communications capabilities. In addition, the mobile device 1000 may have the capability to communicate with other computer systems via the Internet.

Operating system software executed by the processing device 1800 is stored in a persistent store, such as the flash memory 1160, but may be stored in other types of memory devices, such as a read only memory (ROM) or similar storage element. In addition, system software, specific device applications, or parts thereof, may be temporarily loaded into a volatile store, such as the random access memory (RAM) 1180. Communications signals received by the mobile device may also be stored in the RAM 1180.

The processing device 1800, in addition to its operating system functions, enables execution of software applications 1300A-1300N on the device 1000. A predetermined set of applications that control basic device operations, such as data and voice communications 1300A and 1300B, may be installed on the device 1000 during manufacture. In addition, a personal information manager (PIM) application may be installed during manufacture. The PIM may be capable of organizing and managing data items, such as e-mail, calendar events, voice mails, appointments, and task items. The PIM application may also be capable of sending and receiving data items via a wireless network 1401. The PIM data items may be seamlessly integrated, synchronized and updated via the wireless network 1401 with corresponding data items stored or associated with a host computer system.

Communication functions, including data and voice communications, are performed through the communications subsystem 1001, and possibly through the short-range communications subsystem 1020. The communications subsystem 1001 includes a receiver 1500, a transmitter 1520, and one or more antennas 1540 and 1560. In addition, the communications subsystem 1001 also includes a processing module, such as a digital signal processor (DSP) 1580, and local oscillators (LOs) 1601. The specific design and implementation of the communications subsystem 1001 is dependent upon the communications network in which the mobile device 1000 is intended to operate. For example, a mobile device 1000 may include a communications subsystem 1001 designed to operate with the Mobitex™, Data TAC™ or General Packet Radio Service (GPRS) mobile data communications networks, and also designed to operate with any of a variety of voice communications networks, such as Advanced Mobile Phone System (AMPS), time division multiple access (TDMA), code division multiple access (CDMA), Wideband code division multiple access (W-CDMA), personal communications service (PCS), GSM (Global System for Mobile Communications), enhanced data rates for GSM evolution (EDGE), etc. Other types of data and voice networks, both separate and integrated, may also be utilized with the mobile device 1000. The mobile device 1000 may also be compliant with other communications standards such as 3GSM, 3rd Generation Partnership Project (3GPP), Universal Mobile Telecommunications System (UMTS), 4G, etc.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber or user of a device. A GPRS device therefore typically involves use of a subscriber identity module, commonly referred to as a SIM card, in order to operate on a GPRS network.

When required network registration or activation procedures have been completed, the mobile device 1000 may send and receive communications signals over the communication network 1401. Signals received from the communications network 1401 by the antenna 1540 are routed to the receiver 1500, which provides for signal amplification, frequency down conversion, filtering, channel selection, etc., and may also provide analog to digital conversion. Analog-to-digital conversion of the received signal allows the DSP 1580 to perform more complex communications functions, such as demodulation and decoding. In a similar manner, signals to be transmitted to the network 1401 are processed (e.g. modulated and encoded) by the DSP 1580 and are then provided to the transmitter 1520 for digital to analog conversion, frequency up conversion, filtering, amplification and transmission to the communication network 1401 (or networks) via the antenna 1560.

In addition to processing communications signals, the DSP 1580 provides for control of the receiver 1500 and the transmitter 1520. For example, gains applied to communications signals in the receiver 1500 and transmitter 1520 may be adaptively controlled through automatic gain control algorithms implemented in the DSP 1580.

In a data communications mode, a received signal, such as a text message or web page download, is processed by the communications subsystem 1001 and is input to the processing device 1800. The received signal is then further processed by the processing device 1800 for an output to the display 1600, or alternatively to some other auxiliary I/O device 1060. A device may also be used to compose data items, such as e-mail messages, using the keypad 1400 and/or some other auxiliary I/O device 1060, such as a touchpad, a rocker switch, a thumb-wheel, or some other type of input device. The composed data items may then be transmitted over the communications network 1401 via the communications subsystem 1001.

In a voice communications mode, overall operation of the device is substantially similar to the data communications mode, except that received signals are output to a speaker 1100, and signals for transmission are generated by a microphone 1120. Alternative voice or audio I/O subsystems, such as a voice message recording subsystem, may also be implemented on the device 1000. In addition, the display 1600 may also be utilized in voice communications mode, for example to display the identity of a calling party, the duration of a voice call, or other voice call related information.

The short-range communications subsystem enables communication between the mobile device 1000 and other proximate systems or devices, which need not necessarily be similar devices. For example, the short-range communications subsystem may include an infrared device and associated circuits and components, a Bluetooth™ communications module to provide for communication with similarly-enabled systems and devices, or a NFC sensor for communicating with a NFC device or NFC tag via NFC communications.

Many modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

That which is claimed is:
1. A mobile wireless communications device comprising:
a baseband processor configured to generate a baseband signal;
a modulator coupled downstream from the baseband processor;
a power amplifier coupled downstream from the modulator;
an antenna;
a tunable antenna matching network coupled between the power amplifier and the antenna and configured to match an impedance of the antenna and thereby cause a phase change in a transmitted signal output from the antenna; and a feedback path between the tunable antenna matching network and the baseband processor;

the baseband processor configured to:
receive the phase change in the transmitted signal output due to the tunable antenna matching network via the feedback path, and
provide upstream phase change compensation to the baseband signal for the phase change in the transmitted signal output from the antenna,
wherein the baseband processor is configured to provide the upstream phase change compensation to the baseband signal within about one microsecond of the phase change in the transmitted signal output from the antenna.

2. The mobile wireless communications device of claim 1 wherein the tunable antenna matching network is configured to dynamically match the impedance of the antenna.

3. The mobile wireless communications device of claim 1 wherein the baseband processor is configured to provide the upstream phase change compensation based upon an inverse of the phase change in the transmitted signal output from the antenna.

4. The mobile wireless communications device of claim 1 further comprising a receiver, wherein the feedback path between the tunable antenna matching network and the baseband processor does not include the receiver.

5. The mobile wireless communications device of claim 1 wherein the tunable antenna matching network is configured to match the impedance of the antenna substantially instantaneously.

6. The mobile wireless communications device of claim 1 wherein the baseband processor is configured to generate digital baseband In-phase (I) and Quadrature (Q) signals.

7. The mobile wireless communications device of claim 6 wherein the modulator comprises I and Q circuits coupled between the processor and the power amplifier.

8. The mobile wireless communications device of claim 7 wherein each of the I and Q circuits comprises a digital-to-analog converter (DAC), a low pass filter coupled to an output of the DAC, and a mixer coupled to an output of the low pass filter.

9. The mobile wireless communications device of claim 1 further comprising an antenna switch coupled between the power amplifier and the antenna.

10. A mobile wireless communications device comprising:
a baseband processor configured to generate a baseband signal;
a modulator coupled downstream from the baseband processor;
a power amplifier coupled downstream from the modulator;
an antenna;
a tunable antenna matching network coupled between the power amplifier and the antenna and configured to dynamically match an impedance of the antenna and thereby cause a phase change in a transmitted signal output from the antenna; and
a feedback path between the tunable antenna matching network and the baseband processor;
the baseband processor configured to:
directly receive via the feedback path a feedback signal representing the phase change,
generate a compensation signal according to an inverse of the phase change, and
apply the compensation signal to the baseband signal to provide upstream phase change compensation in the baseband signal for the phase change in the transmitted signal output from the antenna,
wherein the baseband processor is configured to apply the compensation signal to the baseband signal within about one microsecond of the phase change in the transmitted signal output from the antenna.

11. The mobile wireless communications device of claim 10 further comprising a receiver, wherein the baseband processor is configured to generate digital baseband In-phase (I) and Quadrature (Q) signals, and wherein the feedback path between the tunable antenna matching network and the processor does not include the receiver.

12. The mobile wireless communications device of claim 11 wherein the modulator comprises I and Q circuits coupled between the baseband processor and the power amplifier.

13. The mobile wireless communications device of claim 12 wherein each of the I and Q circuits comprises a digital-to-analog converter (DAC), a low pass filter coupled to an output of the DAC, and a mixer coupled to an output of the low pass filter.

14. A method of providing impedance matching in a mobile wireless communications device, the method comprising:
matching an impedance of an antenna by adjusting a tunable antenna matching network thereby causing a phase change in a transmitted signal output from the antenna;
directly receiving, by a baseband processor, a feedback signal representing the phase change, the feedback signal being received over a feedback path between the baseband processor and the tunable antenna matching network, the feedback path not including the receiver;
generating, by the baseband processor, a compensation signal according to an inverse of the phase change; and
applying, by the baseband processor, the compensation signal to a baseband signal to provide upstream phase change compensation in the baseband signal for the phase change in the transmitted signal output from the antenna,
wherein the baseband processor applies the compensation signal to the baseband signal within about one microsecond of the phase change in the transmitted signal output from the antenna.

15. The method of claim 14 further comprising using the tunable antenna matching network to dynamically match the impedance of the antenna.

16. The method of claim 14 further comprising using the tunable antenna matching network to match the impedance of the antenna substantially instantaneously.

* * * * *